United States Patent
Jung et al.

(10) Patent No.: US 10,028,339 B2
(45) Date of Patent: Jul. 17, 2018

(54) DISPLAY PANEL AND METHOD OF MANUFACTURING THE SAME

(71) Applicant: Samsung Display Co., Ltd., Yongin, Gyeonggi-Do (KR)

(72) Inventors: Young-Bae Jung, Yongin (KR); Dong-Wook Kim, Yongin (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 211 days.

(21) Appl. No.: 14/038,865

(22) Filed: Sep. 27, 2013

(65) Prior Publication Data
US 2014/0354143 A1 Dec. 4, 2014

(30) Foreign Application Priority Data
Jun. 3, 2013 (KR) .................. 10-2013-0063695

(51) Int. Cl.
| G06F 3/041 | (2006.01) |
| H05B 33/02 | (2006.01) |
| H05B 33/10 | (2006.01) |
| H01L 51/00 | (2006.01) |
| H01L 27/32 | (2006.01) |

(52) U.S. Cl.
CPC ............ *H05B 33/02* (2013.01); *G06F 3/041* (2013.01); *H01L 27/3276* (2013.01); *H01L 51/0097* (2013.01); *H05B 33/10* (2013.01); *Y02E 10/549* (2013.01); *Y02P 70/521* (2015.11)

(58) Field of Classification Search
None
See application file for complete search history.

(56) References Cited

U.S. PATENT DOCUMENTS

| 5,623,275 A * | 4/1997 | Miller ........................... 345/46 |
| 2003/0222833 A1* | 12/2003 | Nakai .................. G06F 1/1626 345/1.1 |
| 2007/0085759 A1* | 4/2007 | Lee et al. ...................... 345/1.1 |
| 2008/0146285 A1* | 6/2008 | Lee ..................... H04M 1/0266 455/566 |
| 2011/0095975 A1* | 4/2011 | Hwang et al. ................ 345/156 |
| 2013/0002133 A1* | 1/2013 | Jin et al. ....................... 313/511 |
| 2013/0076649 A1* | 3/2013 | Myers ................ H04M 1/0268 345/173 |
| 2013/0083496 A1* | 4/2013 | Franklin et al. .............. 361/749 |
| 2014/0300533 A1* | 10/2014 | Cho et al. ..................... 345/156 |
| 2014/0375702 A1* | 12/2014 | Cho et al. ..................... 345/690 |

FOREIGN PATENT DOCUMENTS

| DE | 102012211232 A1 | 1/2013 |
| EP | 0709819 A1 | 5/1996 |
| KR | 1020080015668 A | 2/2008 |

OTHER PUBLICATIONS

The Extended European Search Report for European Patent Application No. 14152760.6 dated Feb. 4, 2015.

\* cited by examiner

*Primary Examiner* — Stephen T Reed
(74) *Attorney, Agent, or Firm* — Cantor Colburn LLP

(57) ABSTRACT

A display panel includes: a substrate including a first area, a second area forming a predetermined angle with the first area, and a first bending area between the first area and the second area; a first display unit and a first embedded circuit unit in the first area of the substrate; and a second display unit and a second embedded circuit unit in the second area of the substrate.

15 Claims, 3 Drawing Sheets

DISPLAY PANEL AND METHOD OF MANUFACTURING THE SAME

This application claims priority to Korean Patent Application No. 10-2013-0063695, filed on Jun. 3, 2013, and all the benefits accruing therefrom under 35 U.S.C. § 119, the disclosure of which is incorporated herein in its entirety by reference.

BACKGROUND

1. Field

The invention relates to a display panel and a method of manufacturing the same, and more particularly, to a display panel and a method of manufacturing the same, whereby a defect at a bent portion of the display panel may be reduced or effectively prevented.

2. Description of the Related Art

A display panel indicates an apparatus that displays an image using an image signal. The display panel corresponds to a concept that includes all apparatuses such as a television, a digital camera, a smart phone, a notebook, a tablet personal computer, a camcorder, a video camera, or the like that display the image using the image signal input from an outer source.

Recently, a flexible display panel is being studied and developed as a next-generation display panel to be applied to portable and various-shape apparatuses. In particular, the flexible display panel based on an organic light-emitting display technology is one of leading display apparatuses.

Also, research is being conducted with the aim of allowing a user to view the display panel not only from a front position of the display panel but also from a side position of the display panel.

SUMMARY

One or more exemplary embodiment of the invention provides a display panel and a method of manufacturing the display panel, whereby a defect due to bending the display panel may be reduced or effectively prevented.

According to an exemplary embodiment of the invention, there is provided a display panel including: a substrate including a first area, a second area forming a first predetermined angle with the first area, and a first bending area between the first area and the second area; a first display unit and a first embedded circuit unit in the first area of the substrate; and a second display unit and a second embedded circuit unit in the second area of the substrate.

The substrate may be a flexible substrate.

The substrate may further include a third area at an opposite side of the first area than the second area and forming a second predetermined angle with the first area, and a second bending area between the third area and the first area.

The display panel may further include conductive lines on the substrate excluding the first bending area and the second bending area of the substrate.

The display panel may further include an organic insulating layer on the substrate, and the first bending area and the second bending area of the substrate may include only the organic insulating layer.

The display panel may further include a third display unit and a third embedded circuit unit in the third area of the substrate.

Each of the first, second, and third embedded circuit units may include a scan driver and an emission driver.

The display panel may further include a first pad portion in the first area of the substrate, a second pad portion in the second area of the substrate, and a third pad portion in the third area of the substrate.

The display panel may further include a flexible printed circuit board ("FPCB") electrically connected to the first pad portion, the second pad portion and the third pad portion.

A size of the second area may be equal to a size of the third area.

A distance between the first bending area and the second bending area may be greater than a distance between the first bending area and a distal edge of the substrate opposite to the first area.

According to another exemplary embodiment of the invention, there is provided a method of manufacturing a display panel, the method including preparing a substrate which is flexible and includes a first area, a second area, and a first bending area between the first area and the second area; providing a first display unit, conductive lines and a first embedded circuit unit on the substrate; and bending the substrate at the first bending area to dispose the first area and the second area of the substrate at a predetermined angle with respect to each other. The conductive lines are on the substrate excluding the first bending area of the substrate.

The method may further include providing an inorganic insulating layer on the substrate excluding the first bending area of the substrate.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION

Figure 1:
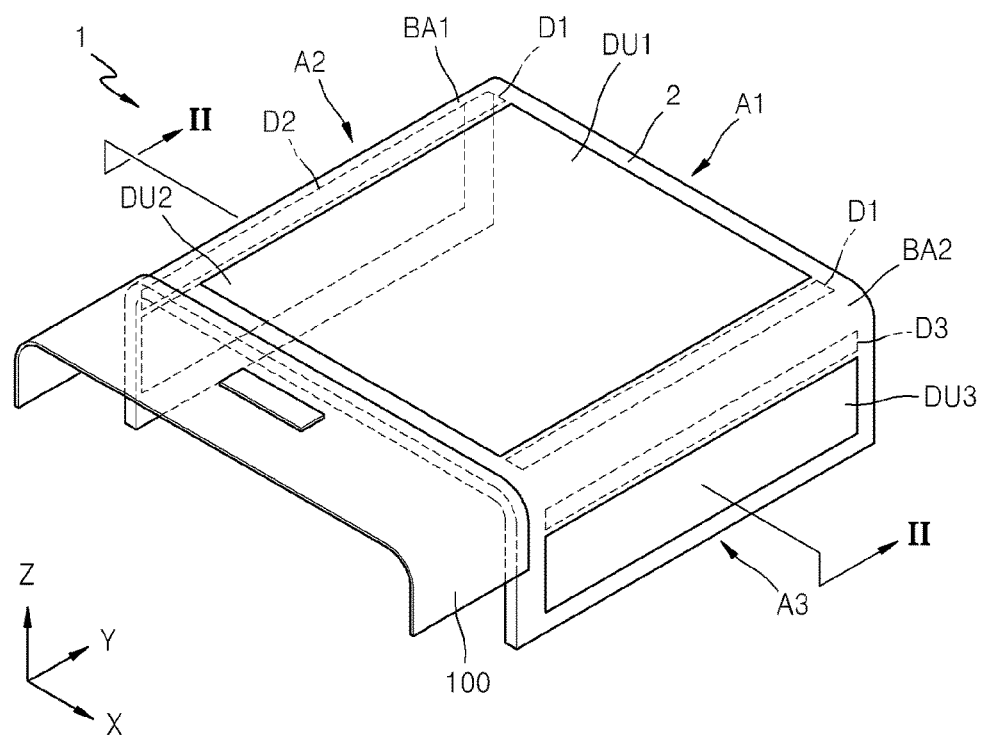
FIG. 1 is a perspective view illustrating an exemplary embodiment of a display panel according to the invention.

The invention will now be described more fully with reference to the accompanying drawings, in which exemplary embodiments of the invention are shown. The invention may, however, be embodied in many different forms, and should not be construed as being limited to the embodiments set forth herein. Thus, the invention may include all revisions, equivalents, or substitutions which are included in the concept and the technical scope related to the invention. For convenience of description, the dimension of elements in the drawings may be exaggerated for clarity. For example, a size and thickness of each element in the drawings are for convenience of description and thus may vary.

Throughout the specification, X, Y and Z-axes are not limited to three axes in a rectangular coordinate system and may include them. For example, the X, Y and Z-axes may be perpendicular to each other or may indicate different directions that are not perpendicular to each other.

It will be understood that when a layer, a film, a region, a plate, or the like is referred to as being "on" another layer, film, region, or plate, the layer, film, region, or plate can be directly on another layer, film, region, or plate or intervening layer, film, region, or plate may also be present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

As discussed above, a flexible display panel is being studied and developed as a next-generation display panel to be applied to portable and various-shape apparatuses. In particular, the flexible display panel based on an organic light-emitting display technology is one of leading display apparatuses. However, when a portion of the flexible display panel is bent, the flexible display panel has a problem in that various defects and a reliability issue occur at the bent portion. Therefore, there remains a need for an improved flexible display panel for which defects at a bent portion thereof are reduced or effectively prevented.

Hereinafter, the invention will be described in detail with reference to the accompanying drawings.

Figure 2:
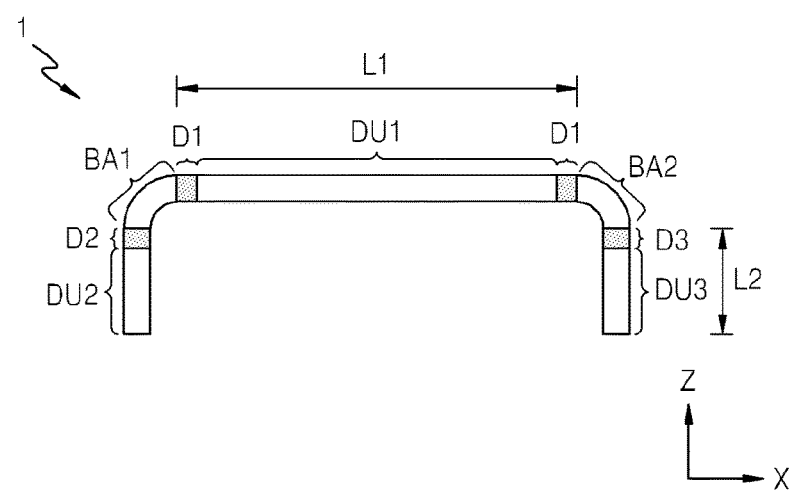
FIG. 2 is a cross-sectional view, taken along line II-II of the display panel of FIG. 1.

FIG. 1 is a perspective view illustrating an exemplary embodiment of a display panel 1 according to the invention. FIG. 2 is a cross-sectional view, taken along line II-II of the display panel 1 of FIG. 1. The display panel 1 may also be referred to as a flexible display panel 1.

Referring FIGS. 1 and 2, the display panel 1 includes a first area A1, a second area A2 and a third area A3. A size of the second area A2 may be substantially the same or equal to a size of the third area A3, but the invention is not limited thereto. As used herein, a size may refer to the planar dimension of the areas A1, A2 and A3.

The display panel 1 includes a substrate 2, and the substrate 2 may be a flexible substrate 2. The flexible substrate 2 may include a polymer material such as a plastic film that may be deformed and bent. The flexible substrate 2 may include the polymer material such as polyimide ("PI"), polycarbonate ("PC"), polyethersulphone ("PES"), polyethylene terephthalate ("PET"), polyethylenenaphthalate ("PEN"), polyarylate ("PAR"), fiber glass reinforced plastic ("FRP"), or the like. The flexible substrate 2 may be a single, unitary, indivisible member, but the invention is not limited thereto.

The first area A1 of the display panel 1 may include a first display unit DU1 and a first embedded circuit unit D1. The first area A1 may include a plurality of first embedded circuit units D1. The first display unit DU1 may be substantially planar and may correspond to a main display screen of the display panel 1.

The second area A2 may include a second display unit DU2 and a second embedded circuit unit D2. The third area A3 may include a third display unit DU3 and a third embedded circuit unit D3. The third area A3 may correspond to and face the second area A2 with the first area A1 interposed therebetween. The second display unit DU2 and the third display unit DU3 may be positioned at sides of the display panel 1, and thus may correspond to sub-display screens. Sizes of the display unit DU2 and the third display unit DU3 may be substantially equal to each other, but the invention is not limited thereto. As used herein, a size may refer to the planar dimension of the display units DU1, DU2 and DU3. The first area A1 may be disposed in a first plane (e.g., in the X-Y direction), while the second and third areas A2 and A3 are respectively disposed in second and third planes different from the first plane (e.g., parallel to the Y-Z direction).

The flexible substrate 2 may be bent at a first bending area BA1 between the first area A1 and the second area A2, so that the first area A1 and the second area A2 may form a predetermined angle. Also, the flexible substrate 2 may be bent at a second bending area BA2 between the first area A1 and the third area A3, so that the first area A1 and the third area A3 may form a predetermined angle. The first area A1 may be considered a front surface of the display panel 1, and second and third areas A2 and A3 may be considered respective side surfaces of the display panel 1.

Referring to FIG. 2, the second area A2 and the third area A3 are disposed at opposing sides of the first area A1, respectively, so that the flexible substrate 2 is perpendicularly bent at the first bending area BA1 and the second bending area BA2 while the first area A1 is interposed between the first bending area BA1 and the second bending area BA2. The illustrated exemplary embodiment of the display panel 1 has been described with respect to a predetermined angle of 90 degrees between a main display screen and sub-display screens, where the number of sub-display screens is two. However, the invention is not limited thereto. In an alternative exemplary embodiment, for example, a main display screen may form an angle with a sub-display screen different than 90 degrees, and/or the number of sub-display screens may be different than two.

A distance L1 is defined between the first bending area BA1 and the second bending area BA2. The distance L1 may be, but is not limited to, greater than a distance L2 between the first bending area BA1 and a side (or distal) edge of the flexible substrate 2 taken in a direction away from the first area A1. An edge of the second and third display units DU2 and DU3 may be disposed spaced apart from the edge of the flexible substrate 2 or may be disposed to essentially coincide with the edge of the flexible substrate 2.

In the exemplary embodiment of the display panel 1 according to the invention, lines such as conductive wirings or conductive signal lines may not be disposed in the first bending area BA1 and/or the second bending area BA2. In a conventional display panel, a crack occurs in a metal line disposed in a bent portion of a substrate, such that various defects and a reduction in reliability of the conventional display panel occurs. As an example, the crack may occur in the metal lines such that an electrical signal transmitted by the metal lines may not be correctly applied to a display unit of the conventional display panel. However, in the exemplary embodiment of the display panel 1 according to the invention, conductive lines are not disposed at a bent portion of the flexible substrate 2, so that damage or a defect in the conductive lines may be reduced or effectively prevented.

As described above, the first area A1 may include the first display unit DU1, the second area A2 may include the second display unit DU2 and the third area A3 may include the third display unit DU3.

The first display unit DU1 may indicate an element of the display panel 1 which displays an image using an image signal and may correspond to a main display screen of the display panel 1. The first display unit DU1 may include various display devices such as an organic light-emitting diode display device, a liquid crystal display device, an electrophoretic display device, or the like.

The second display unit DU2 and the third display unit DU3 may indicate elements of the display panel 1 which are positioned at the opposing sides of the display panel 1 by being disposed at opposing sides of the first display unit DU1, respectively, and which respectively display an image using an image signal, and may correspond to sub-display screens of the display panel 1. The image displayed by a sub-display panel of the display panel 1 may display the same or a different image than that of the main display screen, and may use the same or a different image signal than the main display screen. Similar to the first display unit DU1, each of the second display unit DU2 and the third display unit DU3 may include various display devices such as the organic light-emitting diode display device, the liquid crystal display device, the electrophoretic display device, or the like.

Hereinafter, for purpose of explanation, the first, second and third display units DU1, DU2 and DU3 are described with respect to an organic light emitting diode.

The organic light-emitting diode OLED includes a pixel electrode 120 (refer to FIG. 4), an opposite electrode (not shown) that is a common layer in the display panel 1, and an intermediate layer (not shown) that is between the pixel electrode 120 and the opposite electrode. Although not illustrated, the organic light-emitting diode OLED may be electrically connected to a thin film transistor TFT and storage capacitor (not shown), so that the first display unit DU1, the second display unit DU2 and/or the third display unit DU3 may emit light.

Light that is emitted from the intermediate layer in the first display unit DU1 may be emitted toward the flexible substrate 2 and/or an encapsulation substrate (not shown).

In addition to a respective display unit, the first area A1 may further include the first embedded circuit unit D1, the second area A2 may further include the second embedded circuit unit D2, and the third area A3 may further include the third embedded circuit unit D3. Each of the first, second and third embedded circuit units D1, D2, and D3 may include a scan driver (not shown) and an emission driver (not shown). In the illustrated exemplary embodiment, the scan driver and the emission driver may be integral, that is, may be a same element or a single, unitary, indivisible member of the display panel 1.

The scan driver may generate scan signals and may transfer the scan signals to pixels of the display panel 1, respectively, via a plurality of scan lines. The emission driver may generate emission control signals and may transfer the emission controls signals to the pixels, respectively, via a plurality of emission lines.

Although not illustrated, each of the first, second and third embedded circuit units D1, D2 and D3 may further include a control unit, a power supply unit, or the like, in addition to the scan driver and the emission driver. The control unit may convert a plurality of image signals (R, G, B), which are input from an external source, into a plurality of image data signals and may transfer the image data signals to the emission driver. The power supply unit may supply an external power to the display panel 1.

In the exemplary embodiment of the display panel 1 according to the invention, the first display unit DU1 may receive an image signal from the first embedded circuit unit D1 including the scan driver and the emission driver. Also, the second and third display units DU2 and DU3 may receive an image signal in the same manner. Thus, the first, second, and third display units DU1, DU2 and DU3 may display image signals that are input from different image signal input units.

Figure 3:
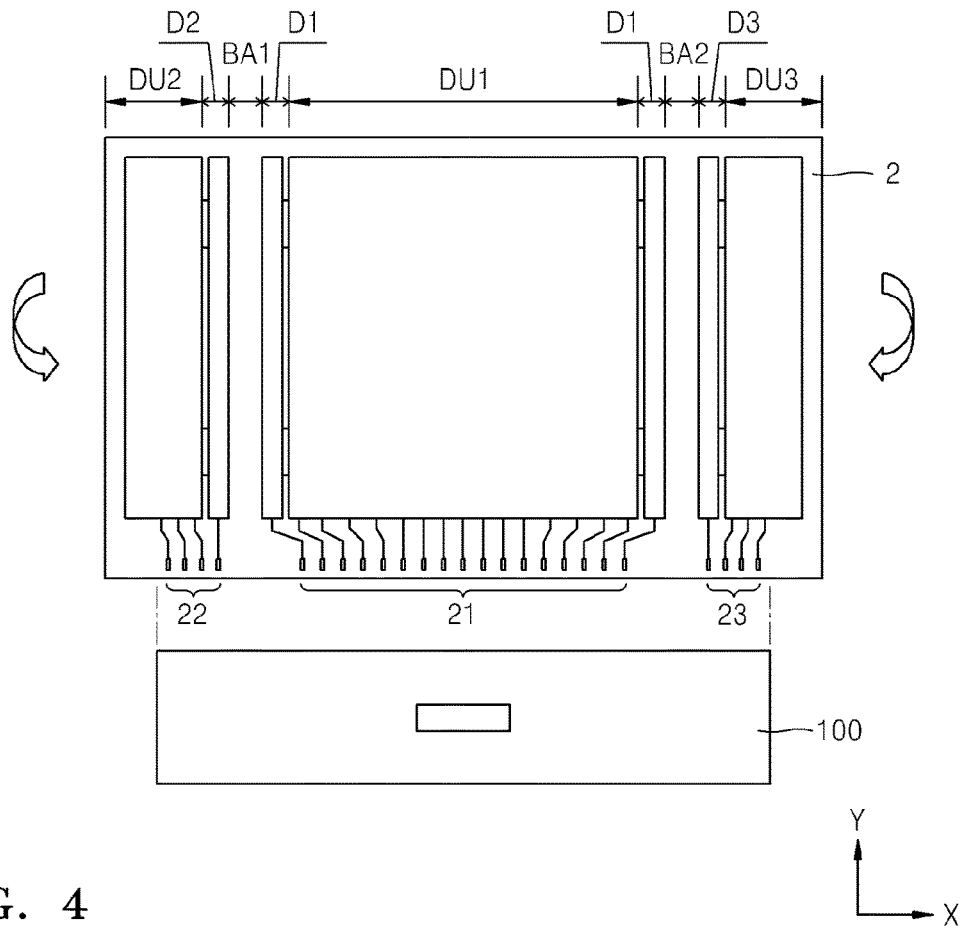
FIG. 3 is a plane view illustrating the display panel of FIG. 1 in an exemplary embodiment of a method of manufacturing the display panel according to the invention.

Although not illustrated in FIGS. 1 and 2, referring to FIG. 3, the flexible substrate 2 may include a first pad portion 21 at an outer side of the first display unit DU1, a second pad portion 22 at an outer side of the second display unit DU2, and a third pad portion 23 at an outer side of the third display unit DU3. The first to third pad portions 21 to 23 may on the flexible substrate 2 and arranged spaced apart from each other along an X-axis of the flexible substrate 2. A flexible printed circuit board ("FPCB") 100 may be attached on the first pad portion 21, the second pad portion 22 and the third pad portion 23 so as to be physically and/or electrically connected to the first pad portion 21, the second pad portion 22 and the third pad portion 23. Elements in the pad portions may be connected to the display units and/or the embedded circuit units by conductive lines, such as signal lines, emission lines or the like. The display units and the embedded circuit units may also be connected to each other by conductive lines.

While an exemplary embodiment of the display panel 1 is mainly described above, the invention is not limited thereto. In another exemplary embodiment of the invention, for example, a method of manufacturing the display panel 1 may also be within the scope of the invention.

Figure 4:
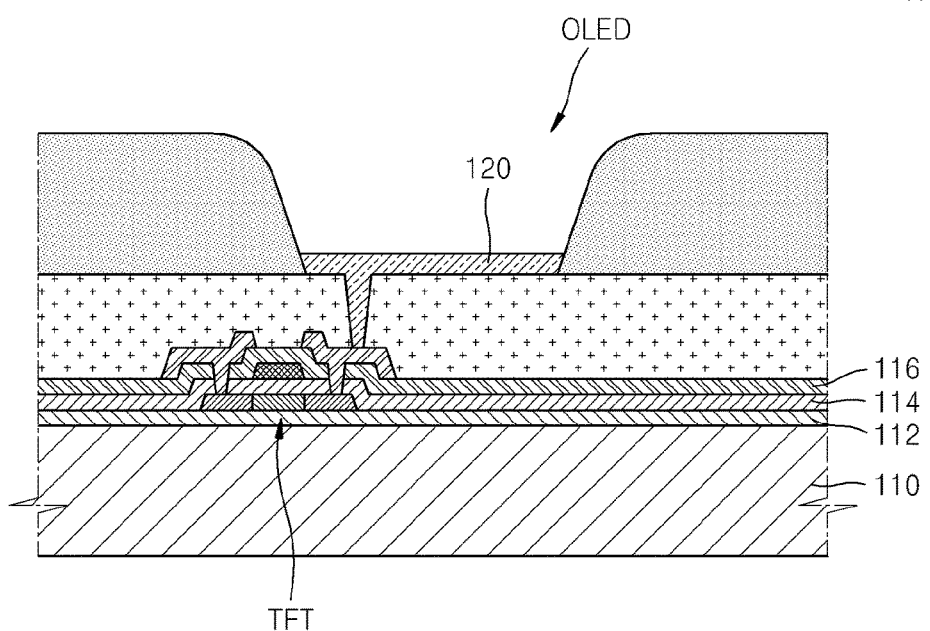
FIG. 4 is a cross-sectional view illustrating an exemplary embodiment of a display unit a display panel according to the invention.

FIG. 3 is a plane view illustrating the display panel 1 of FIG. 1 in an exemplary embodiment of a method of manufacturing a display panel according to the invention. The display panel 1 in FIG. 1 may represent an un-bent state of the display panel 1 before deforming or bending of the display panel 1 in the direction indicated by the curved arrows. FIG. 4 is a cross-sectional view illustrating an exemplary embodiment of a display unit according to the invention. The display unit illustrated in FIG. 4 may be applied as the first, second and/or third display unit DU1, DU2 and/or DU3 described above, but the invention is not limited thereto.

Referring to FIGS. 3 and 4, an exemplary embodiment of a method of manufacturing the display panel 1 may include an operation of preparing a substrate 110 that is flexible and that includes the first area A1, the second area A2, and the first bending area BA1 between the first area A1 and the second area A2.

A buffer layer 112 may be formed (e.g., provided) on the substrate 110. The buffer layer 112 may include an inorganic layer including SiOx, SiNx, SiON, AlO, AlON or the like, or an organic layer including acryl, polyimide or the like. The buffer layer 112 may be a monolayer including the inorganic layer or the organic layer, or may be a multi-layer structure including the organic layer and the inorganic layer alternately stacked. The buffer layer 112 may reduce or effectively prevent oxygen and moisture from penetrating into the first, second and third display units DU1, DU2 and DU3 via the substrate 110.

The method may further include an operation of forming a display unit and an embedded circuit unit on the substrate 110. In the operation of forming the display unit and the embedded circuit unit, conductive lines are not provided in the first bending area BA1 of the substrate 110. If the conductive lines are disposed in the first bending area BA1, when the flexible substrate 110 is deformed to be bent at the first bending area BA1, a crack occurs in the conductive lines such that an electrical signal may not be transferred to the display unit. However, in the exemplary embodiment of the display panel 1, since the conductive lines are not provided in the first bending area BA1, a defect in the conductive lines due to the crack may be reduced or effectively prevented.

As illustrated in FIG. 3, the method may further include an operation of deforming the substrate 2 to bend the substrate 2 at the first bending area BA1 so as to allow the first area A1 and the second area A2 of the substrate 2 to form a predetermined degree. Here, by omitting the conductive lines in the first bending area BA1 of the flexible substrate 2, a defect in the display panel 1 due to the crack in the conductive lines, where the crack causes a defect in which an electrical signal is not transferred to the display unit, is reduced or effectively prevented.

As described above, when the display panel 1 is manufactured to include the flexible substrate 2, metal lines and thin films are excluded from a bent portion of the substrate 2, so that a crack of the flexible substrate 2 may also be reduced or effectively prevented, and various defects in the display panel 1 due to the crack may be improved.

Figure 5:
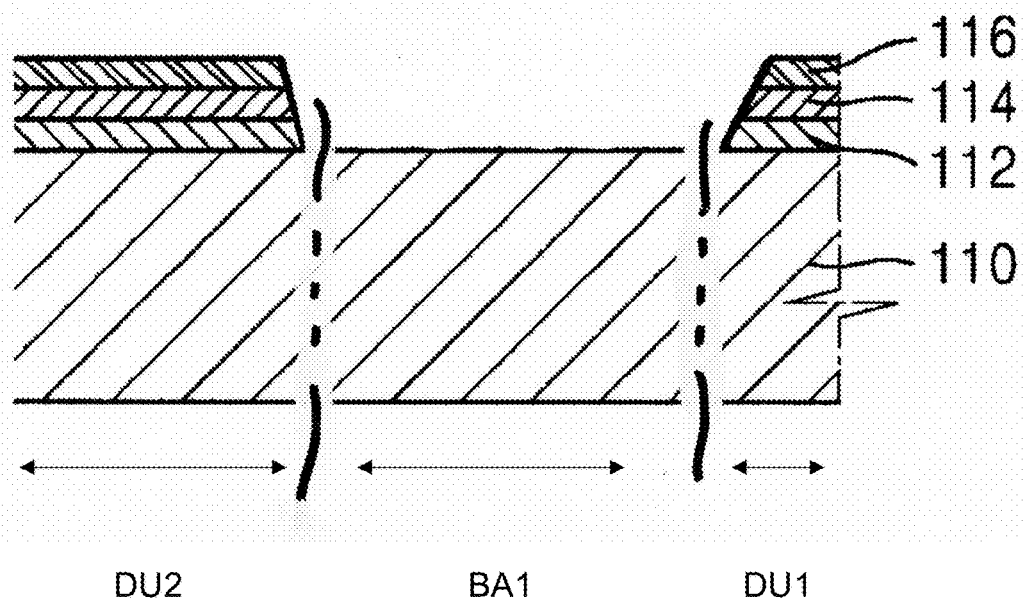
FIG. 5 is a cross-sectional view illustrating an exemplary embodiment of a bending area relative to a display unit of a display panel according to the invention.

In addition to the feature of excluding the conductive lines in the first bending area BA1, an inorganic insulating layer may be omitted in the first bending area BA1. In one exemplary embodiment, for example, since the buffer layer 112, a gate insulating layer 114 and a first insulating layer 116 may include an inorganic material such as $SiO_2$, $SiNx$, $SiON$, $Al_2O_3$, $TiO_2$, $Ta_2O_5$, $HfO_2$, $ZrO_2$, BST, PZT or the like, a crack may occur in these inorganic insulating layers when the substrate 2 is bent. Thus, in order to reduce or effectively prevent such a problem, in the operation of forming the display unit and the embedded circuit unit, the inorganic insulating layers are omitted in the first bending area BA1. Referring to FIG. 5, in one exemplary embodiment, for example, after the buffer layer 112, the gate insulating layer 114 and the first insulating layer 116 are formed, the buffer layer 112, the gate insulating layer 114 and the first insulating layer 116 may each be patterned to be removed from the first bending area BA1. Such patterning may be done in discrete operations, or all of the layers may be patterned at substantially a same time and/or in a same single operation.

As described above, since the inorganic insulating layers are excluded from the first bending area BA1, only an organic insulating layer may remain in the first bending area BA1. The organic insulating layer may include polymer derivatives having commercial polymers such as poly(methyl methacrylate ("PMMA") and polystyrene ("PS") and a phenol group, an acryl-based polymer, an imide-based polymer, an allyl ether-based polymer, an amide-based polymer, a fluorine-based polymer, a p-xylene-based polymer, a vinyl alcohol-based polymer, or a combination thereof.

According to one or more exemplary embodiment of the display panel and the method of manufacturing the same according to the invention, a defect in the display panel due to bending of the display panel may be reduced or effectively prevented.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:
1. A display panel comprising:
 a substrate comprising:
  a first area thereof disposed in a first side;
  a second area thereof adjacent to the first area along a first direction, the second area disposed in a second side forming a first predetermined angle with the first side in which the first area is disposed; and
  a first bending area thereof connecting the first area to the second area, the first bending area defined by an entire portion of the substrate along the first direction which is between the first area disposed in the first side and the second area disposed in the second side; and
 a plurality of display units and a plurality of embedded circuits respectively connected to the plurality of display units,
 wherein
 a first display unit and a first embedded circuit connected thereto, are each disposed in the first area disposed in the first side; and
 a second display unit and a second embedded circuit connected thereto, are each disposed in the second area disposed in the second side;
 the first bending area as the entire portion of the substrate along the first direction which is between the first and second areas does not include the first display unit, the first embedded circuit unit connected thereto, the second display unit or the second embedded circuit connected thereto, and no display unit among the plurality of display units is disposed between the first embedded circuit and the second embedded circuit.

2. The display panel of claim 1, wherein the substrate comprises a flexible substrate.

3. The display panel of claim 1, wherein the substrate further comprises:
a third area adjacent to the first area at an opposite side of the first area than the second area, the third area disposed in a third side forming a second predetermined angle with the first side in which the first area is disposed, and
a second bending area connecting the first area to the third area, the second bending area defined by an entire portion of the substrate along the first direction which is between the first area disposed in the first side and the third area disposed in the third side.

4. The display panel of claim 3, further comprising conductive lines which connect the plurality of display units and the plurality of embedded circuits respectively to each other,
wherein
the conductive lines are disposed in the first area disposed in the first side and the second area disposed in the second side, and
the first bending area as the entire portion of the substrate along the first direction which is between the first and second areas does not include the conductive lines.

5. The display panel of claim 4, further comprising an inorganic insulating layer on the substrate excluding the first bending area of the substrate.

6. The display panel of claim 3, further comprising:
a third display unit and a third embedded circuit unit connected to the third display unit, each disposed in the third area disposed in the third side, and
the second bending area as the entire portion of the substrate along the first direction which is between the first and third areas does not include the first display unit, the first embedded circuit unit connected thereto, the third display unit or the third embedded circuit connected thereto.

7. The display panel of claim 6, wherein each of the first, second and third embedded circuit units comprises a scan driver and an emission driver.

8. The display panel of claim 6, further comprising:
a first pad portion in the first area of the substrate,
a second pad portion in the second area of the substrate, and
a third pad portion in the third area of the substrate.

9. The display panel of claim 8, further comprising a flexible printed circuit board which is electrically connected to the first pad portion, the second pad portion and the third pad portion.

10. The display panel of claim 3, wherein a size of the second area is substantially equal to a size of the third area.

11. The display panel of claim 10, wherein a distance between the first bending area and the second bending area is greater than a distance between the first bending area and a distal edge of the substrate opposite to the first area.

12. A method of manufacturing a display panel, the method comprising:
preparing a substrate which is flexible and comprises: a first area, a second area and a first bending area adjacent to each other along a first direction;
providing a display unit, conductive lines, and an embedded circuit unit which is connected to the display unit in each of the first and second areas of the substrate; and
bending the substrate at the first bending area to dispose:
the first area in a first side,
the second area in a second side forming a predetermined angle with the first side in which the first area is disposed and
the first bending area connecting the first area to the second area, the first bending area defined by an entire portion of the substrate along the first direction which is between the first area disposed in the first side and the second area disposed in the second side,
wherein
the first bending area as the entire portion of the substrate in the first direction which is between the first and second areas does not include any display unit or embedded circuit unit among those in each of the first and second areas of the substrate, and
no display unit among the plurality of display units is disposed between the first embedded circuit and the second embedded circuit.

13. The method of claim 12, further comprising providing an inorganic insulating layer on the substrate excluding the first bending area of the substrate.

14. The method of claim 12, wherein the substrate comprises a single, unitary, indivisible member.

15. The method of claim 12,
further comprising:
providing a first pad portion in the first area of the substrate, and a second pad portion in the second area of the substrate, and
connecting a first portion and a second portion of a flexible printed circuit board to the first pad portion and the second pad portion of the substrate, respectively,
wherein the first and second portions of the flexible printed circuit board form the predetermined angle with respect to each other.

* * * * *